(12) United States Patent
Hanham et al.

(10) Patent No.: US 10,886,947 B2
(45) Date of Patent: Jan. 5, 2021

(54) EFFICIENT DECODING OF N-DIMENSIONAL ERROR CORRECTION CODES

(71) Applicant: Toshiba Memory Corporation, Tokyo (JP)

(72) Inventors: Paul Edward Hanham, Froxfield (GB); David Malcolm Symons, Oxon (GB); Francesco Giorgio, Headington (GB)

(73) Assignee: Toshiba Memory Corporation, Tokyo (JP)

( * ) Notice: Subject to any disclaimer, the term of this patent is extended or adjusted under 35 U.S.C. 154(b) by 42 days.

(21) Appl. No.: 16/228,256

(22) Filed: Dec. 20, 2018

(65) Prior Publication Data
US 2020/0201708 A1    Jun. 25, 2020

(51) Int. Cl.
| | | |
|---|---|---|
| *H03M 13/29* | (2006.01) | |
| *G06F 11/10* | (2006.01) | |
| *G11C 29/52* | (2006.01) | |

(52) U.S. Cl.
CPC ..... *H03M 13/2906* (2013.01); *G06F 11/1068* (2013.01); *G11C 29/52* (2013.01)

(58) Field of Classification Search
CPC ........... H03M 13/098; H03M 13/2906; H03M 13/2771; H03M 13/2909; H03M 13/2927; H03M 13/2957; H03M 13/29; G06F 11/1048; G06F 11/1068; G06F 11/1072; G11C 29/42; G11C 29/52
See application file for complete search history.

(56) References Cited

U.S. PATENT DOCUMENTS

| | | | |
|---|---|---|---|
| 8,713,417 B2 | 4/2014 | Jo | |
| 10,439,645 B2* | 10/2019 | Maunder | H03M 13/2771 |
| 2011/0072331 A1 | 3/2011 | Sakaue et al. | |
| 2011/0246853 A1* | 10/2011 | Kim | G06F 11/1048 |
| | | | 714/758 |
| 2017/0187397 A1* | 6/2017 | Kim | G06F 11/1068 |
| 2018/0302109 A1* | 10/2018 | Heo | H03M 13/098 |

OTHER PUBLICATIONS

Foreign Search Report on PCT PCT/IB2019/061151 dated Apr. 14, 2020.

* cited by examiner

*Primary Examiner* — Shelly A Chase
(74) *Attorney, Agent, or Firm* — Foley & Lardner LLP

(57) ABSTRACT

Various implementations are directed to systems and methods for maintaining integrity and reliability of data in an SSD device using error correction coding. According to certain aspects, for frames of data having an ECC code with two or more sub-codes, while one sub-decoder is not in use it could be used to start a decode of another frame. By "interleaving" and alternating the frames between sub-decoders, two or more frames can be decoded simultaneously in an efficient manner. This can clearly be extended to more sub-codes (i.e. dimensions greater than two).

18 Claims, 7 Drawing Sheets

US 10,886,947 B2

1

EFFICIENT DECODING OF N-DIMENSIONAL ERROR CORRECTION CODES

TECHNICAL FIELD

The present disclosure relates generally to systems and methods for preserving data integrity and reliability of memory systems (e.g. Solid State Drives (SSDs)).

BACKGROUND

A traditional non-volatile memory controller includes Error Correction Code (ECC) decoders configured to correct data from non-volatile memory devices in a memory system such as an SSD. For example, a multi-channel controller with a plurality of memory channels (e.g. 4, 8, 16 etc. memory channels) typically has dedicated channel ECC decoders, one per channel, to provide high-bandwidth, independent parallel operation. Improved efficiency can be obtained by "pooling" ECC decoders for use by all channels, for example as described in U.S. application Ser. No. 16/125,283, the contents of which are incorporated herein by reference in their entirety. However, even further improvements, in efficiency and other aspects, are desirable.

SUMMARY

In certain aspects, the present implementations are directed to systems and methods for maintaining integrity and reliability of data in an SSD device using error correction coding. According to certain aspects, for frames of data having an ECC code with two or more sub-codes, while one sub-decoder is not in use it could be used to start a decode of another frame. By "interleaving" and alternating the frames between sub-decoders, two or more frames can be decoded simultaneously in an efficient manner. Where sub-decoders are pooled, the interleaving and alternating of frames is not restricted to frames sourced from a single memory channel, as frames from different memory channels may be interleaved and alternated between the sub-decoders. This can clearly be extended to more sub-codes (i.e. dimensions greater than two).

DETAILED DESCRIPTION

According to certain general aspects, the present embodiments are related to reliability of data stored in a memory device such as an SSD, and particularly in connection with a non-volatile memory controller for such a memory device. Types of non-volatile memory include NAND flash memory, NOR flash memory, magnetic RAM (MRAM), resistive RAM (RRAM), phase change memory (PCM) and battery-backed volatile memories.

As set forth above, conventional non-volatile memory controllers include ECC decoders configured to correct data from non-volatile memory devices in a memory system such as an SSD. Among other aspects, the present Applicant recognizes that many ECC codes include multiple sub-codes. For example, one type of error correction code called a product code forms a string of bits of data into an n-dimensional array of bits and adds ECC parity (i.e. sub-codes) to each dimension. In the simplest case, each dimension is decoded sequentially by separate sub-decoders, with the hope that previous decodes will aid subsequent decodes. Many of these product codes will use different ECC types for each sub-code, such as Hamming, Reed Solomon (RS), Bose Chaudhuri Hocquengheim (BCH) and Low Density Parity Code (LDPC), and hence require different ECC decoders for each sub-code, with the overall decode alternating between the sub-decoders.

For example, in a product code where two sub-codes are used (i.e., a two-dimensional code), it is typical to provide each read channel with a pair of ECC sub-decoders, e.g. sub-decoders Dec_1 and Dec_2. Product decoding is iterative, where a decode process for an error encoded packet or frame typically includes a round of decoding of the frame performed by Dec_1, followed by a round of decoding of the frame performed by Dec_2, followed by another round of decoding of the frame performed by Dec_1, another round of decoding of the frame performed by Dec_2, and so on. The results of each round of decoding can be used to assist in each subsequent round of decoding of the frame. This alternating sequence is continued until the packet or frame is completely decoded with no errors (i.e. following a last sub-decode Dec_1 or Dec_2 after which the packet or frame has been completely decoded with no errors). It should be noted that the number of "rounds" in this alternating sequence can be predetermined or it can be a variable number (perhaps up to a certain predetermined threshold, after which the frame can be considered "undecoded" or an error frame).

Figure 1:
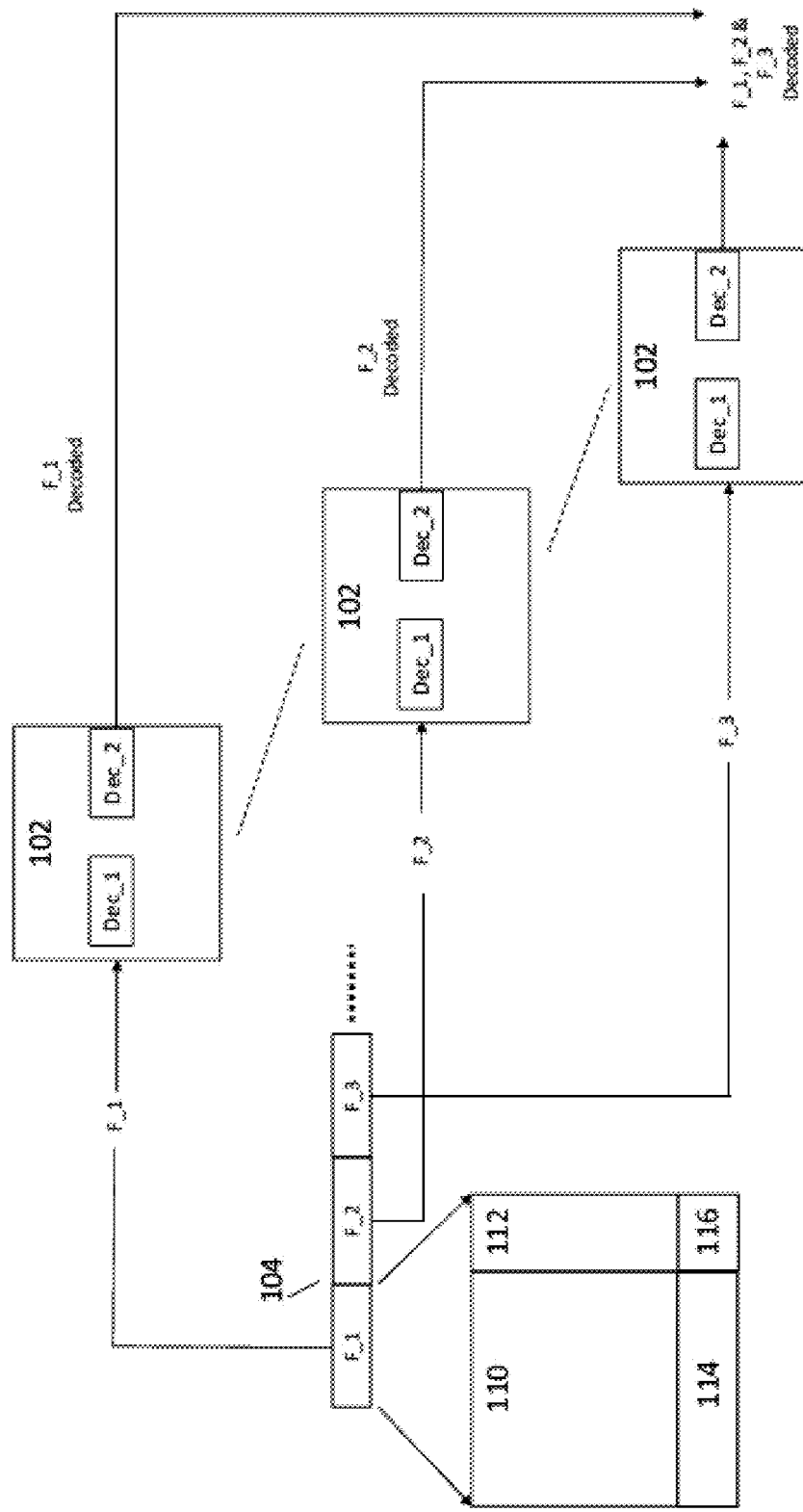
FIG. 1 is a diagram illustrating aspects of conventional two-dimensional error decoding.

FIG. 1 is a diagram illustrating these and other aspects of conventional ECC decoding. As shown in FIG. 1, a string of bits 104 is received, for example from one or more non-volatile memory devices at a controller. The string of bits includes sequential frames or packets of bits, e.g. F_1, F_2, F_3, etc. These frames are each arranged into a two-dimensional array of bits, with ECC parity sub-codes added to each dimension. There may also be parity encoded parity bits, where the parity bits in each row form additional columns of the array (the number depending on the number of parity bits in each row); alternatively the parity bit in each column form additional rows of the array to be encoded. For example, one form of encoding is shown with F_1 as a two-dimensional array of data bits 110, with horizontal sub-code parity bits 112, vertical sub-code parity bits 114 and vertical sub-code parity bits 116 for the additional columns. Hence, for example, where the frames are arranged in 16 or 32 rows of data bits and 128 columns of data bits per row, there will be 16 or 32 groups of parity bits or sub-codes for the rows and 128 groups of parity bits or sub-codes for the columns.

The controller includes an ECC decoder 102, which includes sub-decoders Dec_1 and Dec_2, each of which is respectively dedicated for decoding a particular sub-code in a frame (e.g., Dec_1 decodes the sub-codes for the rows, while Dec_2 decodes the sub-codes for the columns). As set forth above, the sub-decoders Dec_1 and Dec_2 may operate on different types of codes from each other (e.g., BCH, LDPC, etc.). As shown in the example of FIG. 1, the decoder 102 acts sequentially and individually on each frame F_1, F_2, F_3, etc. such that both sub-decoders work together on a single frame until the entire frame is successfully decoded before working to decode a next frame, even if it has already been received at the controller. Accordingly, the frames F_1, F_2 and F_3 are decoded independently in turn, one at a time. In other words, the decoding of frame F_2 cannot begin until frame F_1 has been fully decoded even if it has already been received, and the decoding of frame F_3 cannot begin until frame F_2 has been fully decoded, even if it has already been received.

Figure 2:
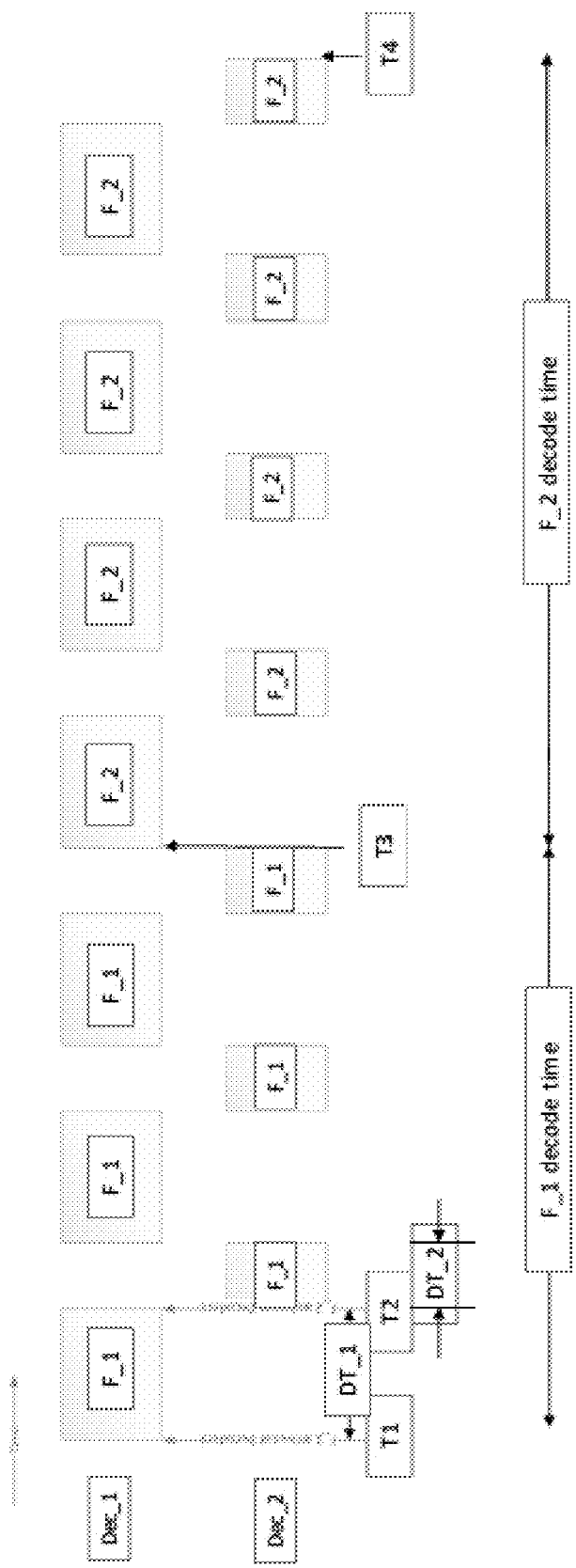
FIG. 2 is a diagram illustrating further aspects of conventional two-dimensional error decoding.

FIG. 2 is a diagram illustrating further aspects of conventional ECC decoding. As shown in this example, a two dimensional product code includes sub-decoders Dec_1 and Dec_2. Sub-decoder Dec_1 takes time DT_1 to perform a decode and sub-decoder Dec_2 takes time DT_2. Assume DT_2<DT_1, as indicated by the different respective widths of the rectangles for Dec_1 and Dec_2, where greater width corresponds to greater decode times. Two frames, F_1 and F_2, arrive at the decoder consecutively at times T1 and T2, respectively. In this example, frame F_1 takes three rounds of both Dec_1 and Dec_2 to fully decode and F_2 takes four rounds of both Dec_1 and Dec_2 to decode.

The example of FIG. 2 shows the conventional situation where both of the sub-decoders are dedicated to decoding F_1 beginning at T1 while the decoding of F_2 is stalled after arriving at T2. The decoding of F_1 alternates between sub-decoder Dec_1 and sub-decoder Dec_2 for as many rounds as necessary for F_1 to be successfully decoded (three in this example). Then, once F_1 is completely decoded at time T3, decoding of F_2 can start. Decoding of F_2 proceeds similarly with as many alternating rounds of sub-decoder Dec_1 and sub-decoder Dec_2 as is necessary for F_2 to be successfully decoded at time T4 (four rounds in this example).

Among other things, the present Applicant recognizes that for an ECC code with two or more sub-codes such as that shown in FIG. 2, while one sub-decoder is not in use, the other(s) could be used to start a decode of another frame. By "interleaving" and alternating the frames between the sub-decoders, two or more frames can be decoded simultaneously. This principle can clearly be extended to more N-dimensional sub-codes of any dimension N greater than two.

Figure 3:
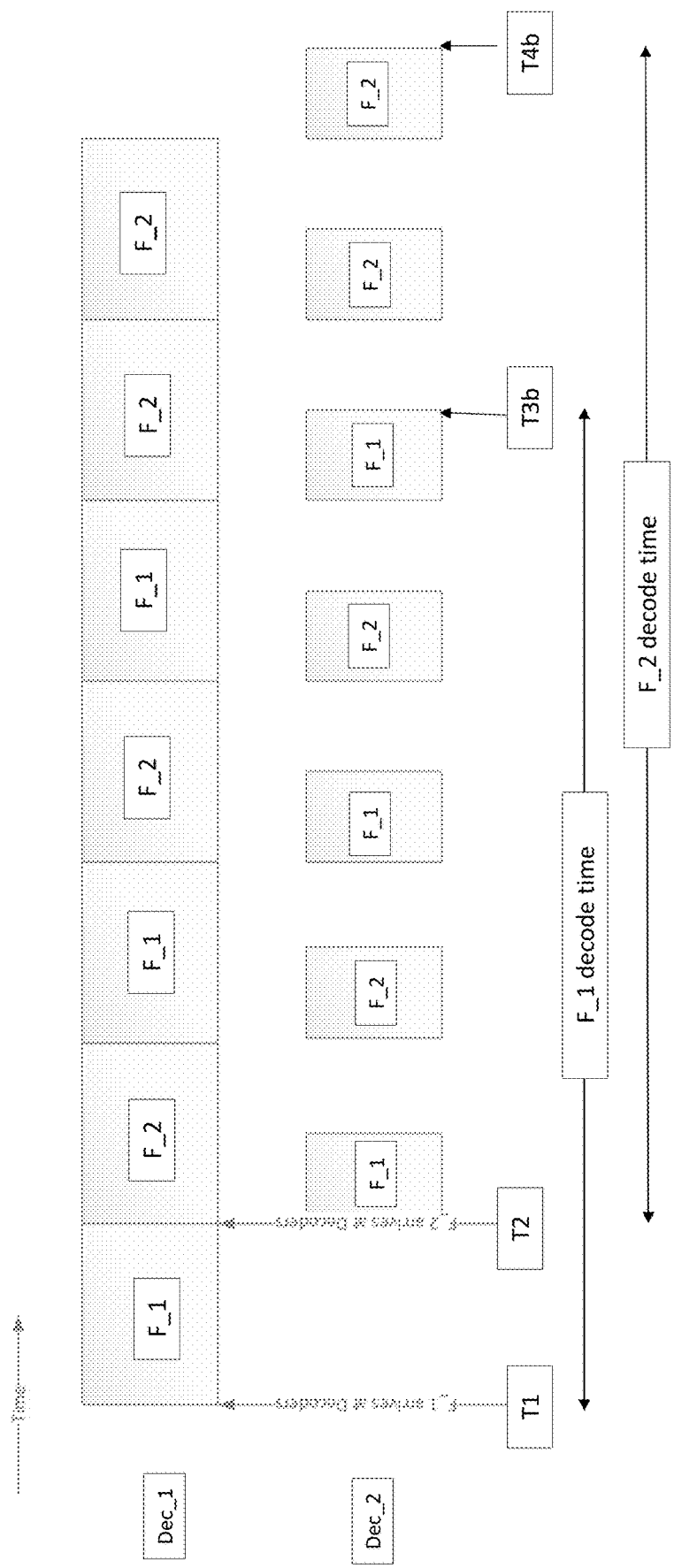
FIG. 3 is a diagram illustrating aspects of two-dimensional error decoding according to embodiments.

FIG. 3 shows what is possible with more fully utilized sub-decoders according to certain aspects of the present embodiments. In this example, two frames are decoded simultaneously, where both sub-decoders of the pair (Dec_1 and Dec_2) are in use at least some of the time in parallel, thereby increasing the efficiency of the overall decoding process.

More particularly, as shown in FIG. 3, when frame F_1 arrives at T1, it is first provided to sub-decoder Dec_1 as in the conventional example. However, when frame F_2 arrives at T2, because sub-decoder Dec_1 has finished a round of decoding of F_1, it is immediately provided to sub-decoder Dec_1 for a round of decoding. Meanwhile, at T2, F_1 is simultaneously provided to sub-decoder Dec_2. Then, after F_2 has completed a round of decoding by sub-decoder Dec_1 at T3b, the frames F_1 and F_2 are swapped between sub-decoders Dec_1 and Dec_2, and this process continues until both F_1 and F_2 have fully decoded at time T4b.

Comparing the conventional scheme shown in FIG. 2 to the example scheme according to embodiments in FIG. 3, conventionally from frame F_1 arrival at T1, F_1 takes a total time of 3*(DT_1+DT_2) to successfully decode and from frame F_2 arrival at T2, F_2 takes 6*DT_1+7*DT_2 to successfully decode. And the total elapsed time from F_1 arrival at T1 to successful decoding of both F_1 and F_2 at T4b is 7*(DT_1+DT_2).

By way of comparison, with more fully utilized sub-decoders in FIG. 3, from arrival of, F_1 at T1, successful decoding of F_1 takes 5*DT_1+DT_2. Meanwhile, from the arrival of F_2 at time T2, successful decoding of F_2 takes 6*DT_1+DT_2. So, the total elapsed time between arrival of F_1 at T1 and successful decoding of both F_1 and F_2 at T4b is 7*DT_1+DT_2. So the time for the F_1 decode is slightly longer in the new situation. However, as DT_2 grows to be close to DT_1, the difference is reduced. Moreover, the time taken to decode F_2 is clearly shorter with the new scheme and the total elapsed time taken to decode both F_1 and F_2 is clearly shorter by 6*DT_2 with the new scheme. These gains increase as DT_2 tends towards DT_1 and optimization is achieved when DT_1=DT_2.

Figure 4:
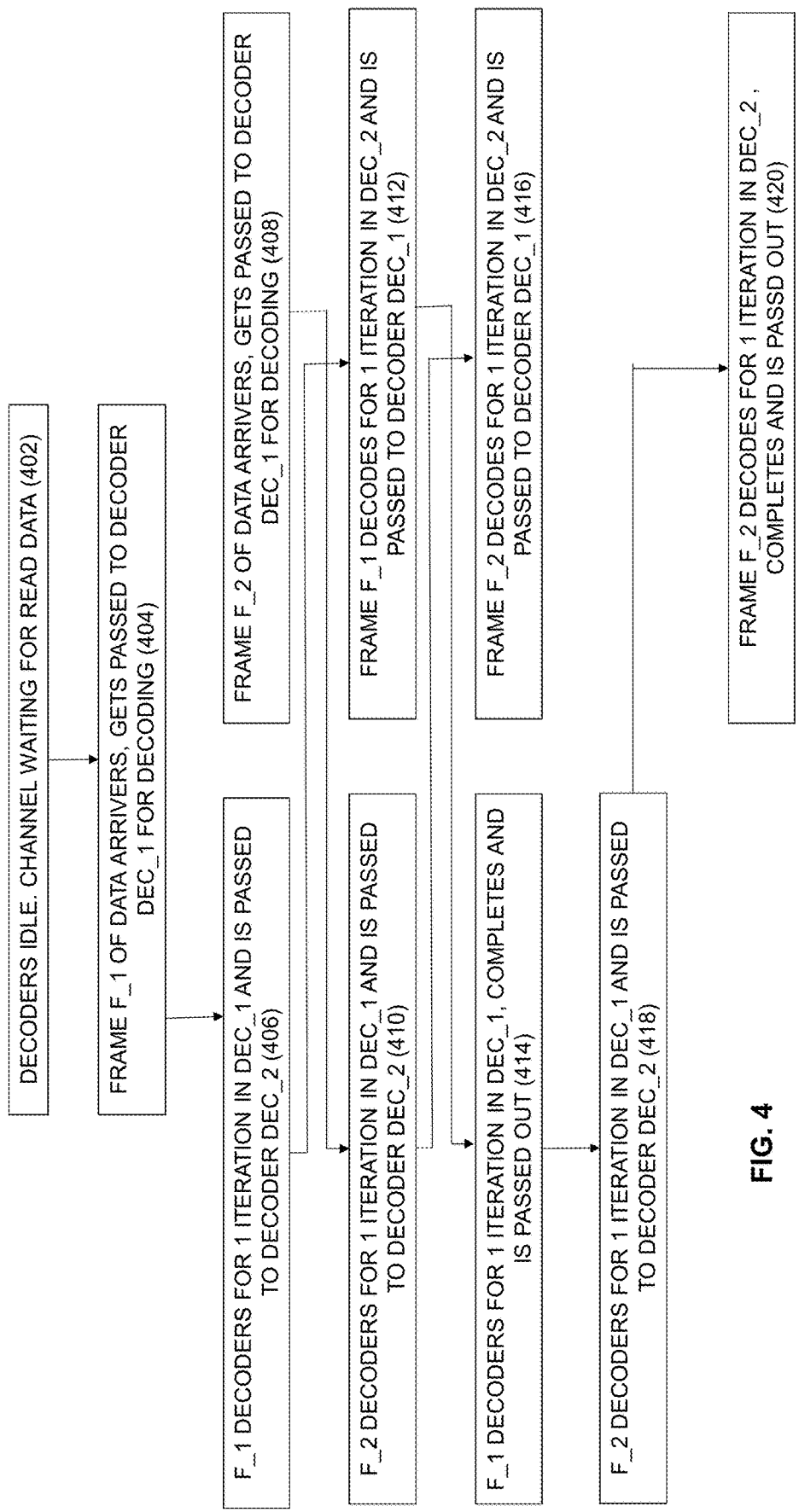
FIG. 4 is a flowchart illustrating an example methodology that can implement error decoding according to embodiments.

FIG. 4 is a flowchart illustrating an example methodology that can be used to implement the above and other aspects of the present embodiments such as those illustrated in connection with FIG. 3.

In block 402, the sub-decoders Dec_1 and Dec_2 are both idle and the channel is waiting for read data.

In block 404, frame F_1 arrives and is provided to sub-decoder Dec_1 for a round of decoding.

In the example of FIG. 4, blocks 406 and 408 can occur at least partially simultaneously to achieve the efficiencies of the present embodiments. In block 406, after F_1 decodes for a first iteration of sub-decoder Dec_1, it is provided to sub-decoder Dec_2 for a first iteration. Meanwhile, frame F_2 arrives and is provided to sub-decoder Dec_1 for a first iteration of decoding as soon as Dec_1 has completed the first iteration of decoding F_1.

Likewise in this example, blocks 410 and 412 can occur at least partially simultaneously. In block 410, after F_2 decodes for a first iteration of sub-decoder Dec_1, it is provided to sub-decoder Dec_2 for a first iteration of decoding. Meanwhile, frame F_1 has already been decoded for a first iteration of Dec_2 and is provided to sub-decoder Dec_1 for another iteration of sub-decoding.

Further likewise in this example, blocks 414 and 416 can occur at least partially simultaneously. In block 414, after F_1 decodes for a final iteration of sub-decoder Dec_1 it is passed out. Meanwhile, frame F_2 completes a round of decoding by sub-decoder Dec_2 and is provided to sub-decoder Dec_1 for another iteration of sub-decoding.

Full decoding of F_2 completes after a final round of processing by sub-decoder Dec_1 in block 418, then a final round of processing by sub-decoder Dec_2 in block 420.

The above embodiments described in connection with FIG. 2 to FIG. 4 can be implemented in an example memory system where each memory channel includes a dedicated decoder. In other embodiments to be described in more detail herein below, further advantageous examples could be constructed with "pooled" sub-decoders and an arbiter, for example as described in U.S. application Ser. No. 16/125,283.

According to certain aspects that will become more apparent below, embodiments including "pooled" sub-decoders make it possible to adjust the respective quantities of Dec_1 and Dec_2 sub-decoders in a product decoding situation so as to avoid the brute force and inefficient way of having to provide the same number M of both sub-decoders to efficiently product decode M packets simultaneously. As will be described, the ratio between the quantities of sub-decoders Dec_1 and Dec_2 can be adjusted according to the number of packets that are required or desired to be decoded simultaneously and the respective decoding times of the Dec_1 and Dec_2 sub-decoders, for example.

Figure 5:
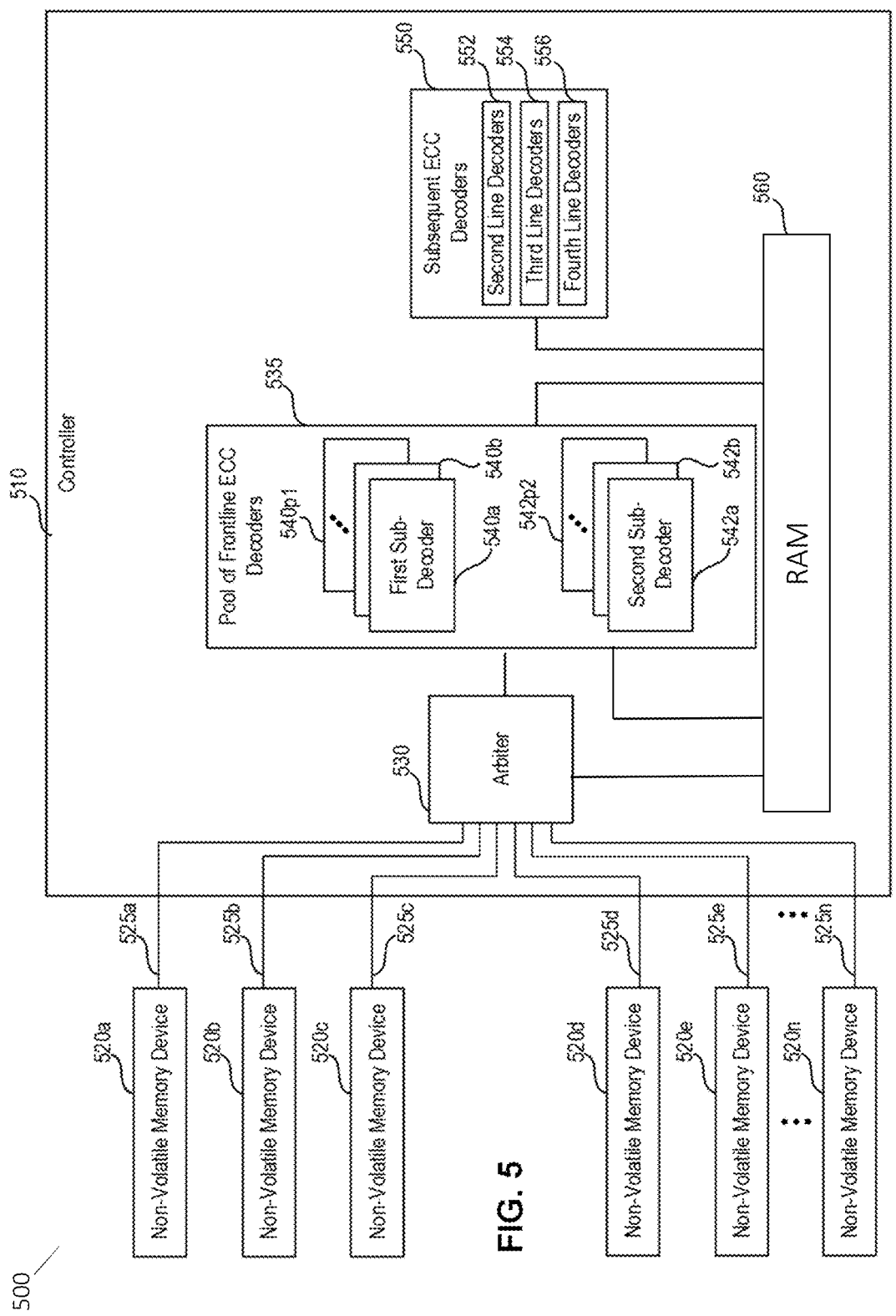
FIG. 5 shows a block diagram of a system for correcting data from non-volatile memory devices of an SSD device, according to some implementations.

FIG. 5 is a block diagram illustrating an example system according to these "pooled" sub-decoder embodiments. More particularly, FIG. 5 shows a block diagram of a system 500 for maintaining reliability and/or integrity of data from non-volatile memory devices 520a-520n, according to some implementations. The system 500 can comprise a portion of an SSD device. In some arrangements, the SSD device can be included in a rack of similar or other types of storage devices in a datacenter (not shown for brevity). However, the principles of the embodiments are not limited to this example implementation.

The system 500 includes the non-volatile memory devices 520a-520n and a controller 510. Controller 510 can be implemented in various ways using processors, logic, firmware and/or software (e.g. including, but not limited to, an application specific integrated circuit (ASIC), a field programmable gate array (FPGA) and a system-on-a-chip (SOC)). Examples of the non-volatile memory devices 520a-520n include but are not limited to, NAND flash memory devices, NOR flash memory devices, magnetic RAM (MRAM), resistive RAM (RRAM), phase change memory (PCM) and battery-backed volatile memories. The non-volatile memory devices 520a-520n are flash memory and can include one or more individual non-volatile dies. Thus, the non-volatile memory devices 520a-520n refer to a plurality of non-volatile memory devices or dies within the SSD device. The non-volatile memory devices 520a-520n can communicate the data stored therein via respective read channels 525a-525n. The read channels 525a-525n are data buses configured to communicate the data stored in the non-volatile memory device 520a-520n to the controller 510 to be processed, responsive to a read command (e.g., issued by the controller 510 to a non-volatile memory device 520a-520n in response to a read request from a host compute device in a datacenter, not shown for clarity).

As described, the controller 510 provides error handling capabilities, among other capabilities not described for sake of clarity of the present embodiments. For example, the data stored in the non-volatile memory devices 520a-520n can be encoded to reduce errors when the data is decoded for reading. Errors may be introduced at the time of writing for storage where memory cells programmed with charge, while the data is being stored (due to the reading/writing of data stored adjacently or leakage of stored charge over time) or when the data is read. In particular, ECC decoders 535 and 550 are provided in the controller 510 to decode and correct the data from devices 520a-520n responsive to a read command. For instance, in an example where the ECC scheme includes two-dimensional product codes, the controller 510 includes a pool of frontline ECC decoders 535 defined by pooled first sub-decoders 540a-540p1 and pooled second sub-decoders 542a-542p2 (p1 and p2 may be the same or different integer numbers). One of ordinary skill in the art can appreciate that any number of frontline ECC decoders and types of sub-decoders can be pooled together at any given point in time, and that other pools of decoders and/or sub-decoders can be included in pool 535. In any event, the pooled frontline ECC decoders 535 are aggregated in a way such that none of the sub-decoders are provided in or dedicated to any of read channels 525a-525n. Rather, the pooled frontline ECC decoders 535 are shared among the read channels 525a-525n. In general, any one of the decoders 535 in a pool could be flexibly assigned on a frame-by-frame basis to decode any frame of data read from any read channel 525a-525n.

More particularly in this regard, the controller 510 includes an arbiter 530 configured to route data from the non-volatile memory devices 520a-520n to and within the pool 535 and to select or otherwise designate one or more of the pooled frontline ECC decoders 535 to decode the data. The arbiter 530 includes suitable processing and memory capabilities for executing functions described herein. For example, the arbiter 530 may be a processing circuit having a processor and a memory. In some implementations, the arbiter 530 can be implemented with the processing capabilities of the controller 510. In other implementations, the arbiter 530 can be implemented with dedicated processing capabilities. The arbiter 530 is operatively coupled to the read channels 525a-525n to route the data (e.g., frames of data) from the non-volatile memory devices 520a-520n to and within the pool 535.

In embodiments, the selection or assignment of sub-decoders by arbiter 530 has two general aspects: (1) the configuration or assignment of the respective numbers p1 and p2 of pooled sub-decoders; and (2) the routing of individual frames for decoding to particular ones of sub-decoders 540 and 542. The numbers p1 and p2 can be fixed or they can be variable. For example, the numbers p1 and p2 can be based on a priori assumptions about the respective average times required for sub-decoders 540 and 542 to decode a given frame, and these fixed numbers of sub-decoders can be allocated for decoding all frames during operation by arbiter 530. In other examples, the numbers p1 and p2 can be varied by arbiter 530 during operation based on varying power or performance requirements or availability of sub-decoders in pool 535. For example, to reduce overall power consumption by a controller 510 with a pool of p1 decoders, the arbiter 530 could be configured to power down some decoders and operate with a reduced number p1a (p1a<p1), then subsequently to increase performance (due to increased read/write command activity on the SSD device) by powering on additional decoders to operate with p1b decoders (p1a<p1b<p1). Those skilled in the art will be able to implement these and other examples based on the foregoing descriptions.

The controller 510 includes or has access to a Random Access Memory (RAM) 560 that is itself operatively coupled to the arbiter 530, the pool of frontline ECC decoders 535 and subsequent ECC decoders 550. The RAM 560 is configured to act as a buffer for frames of data (1) for the arbiter 530 while waiting for one of the pooled front line decoders to become available, either subsequent to being read from a read channel 520a-520n; (2) for the pooled frontline ECC decoders 535 following a sub-decoding by a sub-decoder 540a-540p1 or 542a-542p2 pending selection or availability of the next sub-decoder; or (3) for the pooled frontline ECC decoders following failure to decode, where the frame is buffered ready for access by subsequent ECC decoders 550.

The subsequent ECC decoders 550 include a second-line ECC decoder 552, a third-line ECC decoder 554, and a fourth-line ECC decoder 556. The subsequent ECC decoders 550 can be updated or configured with firmware. Responsive to determining that the frontline ECC decoders 540a-540n have failed to decode and correct a frame, the frame is sent to the second-line ECC decoder 552 to be decoded or corrected. Responsive to determining that the second-line ECC decoder 552 has failed to decode and correct the frame, the frame is sent to the third-line ECC decoder 554 to be decoded or corrected. Responsive to determining that the third-line ECC decoder 554 has failed to decode and correct the frame, the frame is sent to the fourth-line ECC decoder 556 to be decoded or corrected. One of ordinary skill in the art appreciates that any number of layers or lines of subsequent ECC decoders can be implemented. The decoded and corrected frame is buffered in DRAM 560 for access by subsequent functions to process the decoded and corrected frames (not shown for clarity). In one example, frames that have failed to be decoded by the frontline ECC decoders 535 are put in the DRAM 560. In that regard, the subsequent ECC decoders 550 (e.g., the second-line ECC decoder 552 and/or the third-line ECC decoder 554) can overwrite such failed frames with decoded frames.

In some arrangements not shown in FIG. 5, the controller 510 in the system 500 may provide one or more additional pools of frontline ECC decoders for other non-volatile memory devices in the SSD device, perhaps as well as additional arbiters arranged to handle the additional pools of decoders.

Figure 6:
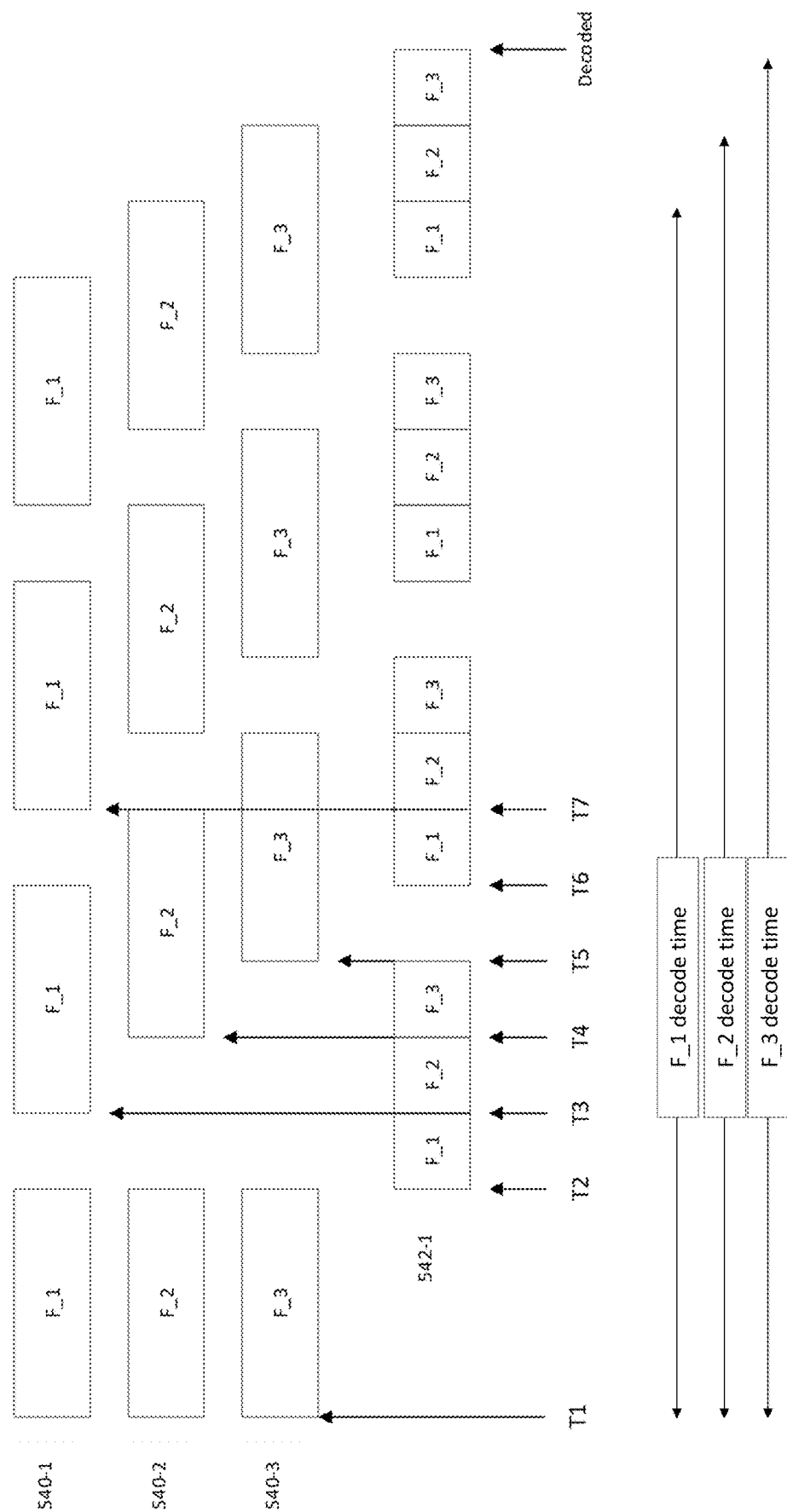
FIG. 6 is a diagram illustrating aspects of error decoding that can be performed using a system such as that illustrated in FIG. 5 according to embodiments.

FIG. 6 is a diagram illustrating aspects of the present embodiments that can be implemented using the example controller 510 of FIG. 5.

In this example, the pool 535 of frontline decoders is configured to comprise three first sub-decoders (e.g. 540-1 to 540-3) for every one second sub-decoder (e.g. 542-1). This configuration is based on an observation that the second sub-decoders 542 are able to operate on a frame at a fraction of the time required by first sub-decoders 540 (one-third of the time in this example). This can be due to the greater complexity of the code associated with first sub-decoders 540 as compared to the complexity of the code associated with the second sub-decoders 542, for example. As shown, controller 510 can begin to decode three packets F_1, F_2 and F_3 simultaneously at T1 (e.g., received from three channels 525 simultaneously, or received sequentially from one or more channels 525 and buffered in RAM 560 into a group of three by arbiter 530) using first sub-decoders 5401-1, 540-2 and 540-3, respectively.

Then at time T2, after sub-decoders 540-1, 540-2 and 540-3 have finished a round of decoding frames F_1, F_2 and F_3, arbiter 530 can provide frame F_1 to sub-decoder 542-1 for a round of decoding. Meanwhile, further decoding of frames F_2 and F_3 is stalled by arbiter 530.

At time T3, sub-decoder 542-1 has finished a round of decoding of frame F_1, so frame F_1 can be provided back to sub-decoder 540-1 by arbiter 530. Simultaneously at T3, since sub-decoder 540-2 has previously finished a round of decoding of frame F_2, arbiter 530 can provide frame F_2 to sub-decoder 542-1 to begin a round of decoding frame F_2.

At time T4, sub-decoder 542-1 has finished a round of decoding of frame F_2, so frame F_2 can be provided back to sub-decoder 540-2 by arbiter 530. Simultaneously at T4, since sub-decoder 540-3 has previously finished a round of decoding of frame F_3, arbiter 530 can provide frame F_3 to sub-decoder 542-1 to begin a round of decoding frame F_3.

At time T5, sub-decoder 542-1 has finished a round of decoding of frame F_3, so frame F_3 can be provided back to sub-decoder 540-3. Since all frames are now being processed by the sub-decoders 540-1, 540-2 and 540-3, processing by sub-decoder 542-1 is temporarily stalled by arbiter 530. Then at time T6, sub-decoder 542-1 can begin another round of decoding frame F_1, and at time T7, sub-decoder 542-1 can begin another round of decoding frame F_2 while sub-decoder 540-1 begins another round of decoding frame F_1.

In this example, the alternation of decoding of each of frames F_1, F_2 and F_3 between sub-decoders 540 and 542 continues for three rounds of each sub-decoder before the frames are successfully decoded. It should be appreciated that this example is provided for illustration purposes, and that fewer or more rounds may be required for either or both of sub-decoders 540 and 542 for successful decoding of any given frame in some embodiments.

As can be seen, overall, frame F_1 finishes decoding as fast as is possible (even though sub-decoder 542-1 needs to wait until sub-decoder 540-1 finishes decoding a given frame and vice versa). Moreover, by "pooling" the quicker sub-decoder 542-1, or multiplexing its use in time between three frames F_1, F_2 and F_3, controller 510 can decode the second frame F_2 with only one additional sub-decoder 542-1 delay to the overall decoding. The third frame F_3 suffers only two additional delays of sub-decoder 542-1 to begin with, but then proceeds at full speed. Still further, efficiency has increased because while three first sub-decoders are used, only one second sub-decoder is required.

It should be apparent that this scheme can be generalised to have different ratios of first and second sub-decoders. For example, if the second sub-decoder can complete a decode in two-thirds of the time as the first sub-decoder, arbiter 530 can allocate three first sub-decoders 540-1 to 540-3 and two second sub-decoders 542-1 and 542-2 in order to efficiently use the decoders.

Figure 7:
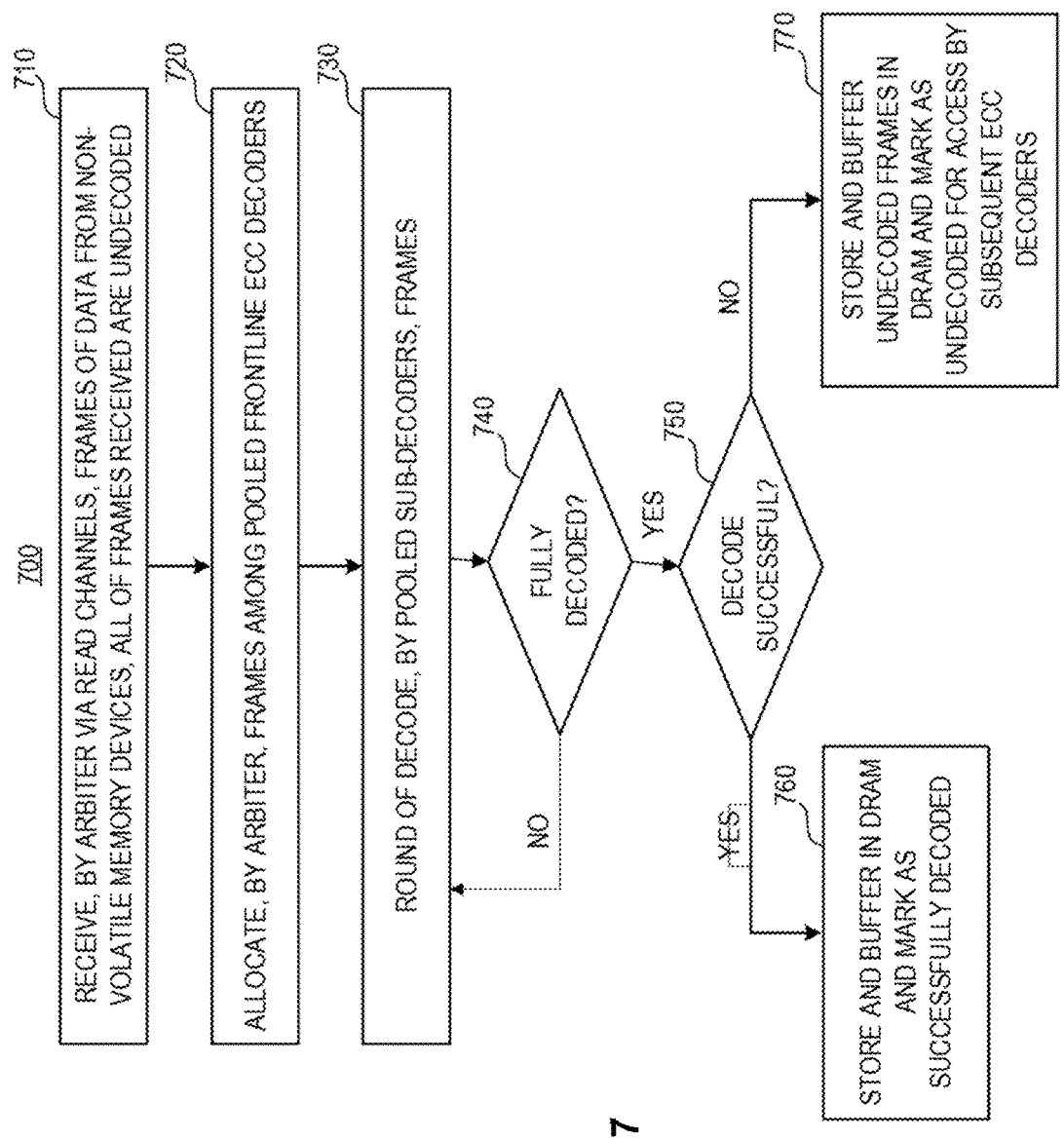
FIG. 7 shows a flow chart of a process for correcting data from non-volatile memory devices of an SSD device, according to some implementations.

FIG. 7 is a flowchart illustrating an example methodology that can be used to implement embodiments such as that shown in FIG. 6. More particularly, FIG. 7 shows a flow chart of a process 700 for correcting data from non-volatile memory devices of an SSD device, according to some implementations.

Referring to FIGS. 5-6, at 710, the arbiter 530 receives via the read channels 525-525n frames of data from the non-volatile memory devices 520a-520n. At this point, all of the frames received have not been decoded or corrected by any ECC decoders.

At 720, the arbiter 530 allocates the frames among the pooled frontline ECC decoders 535. That is, in a two-dimensional product code example, the arbiter 530 selects one of the pooled first sub-decoders 540a-540p1 and one of the pooled second sub-decoders 542a-542p2 for each frame of data received via the channels 525a-525n. In some arrangements, arbiter 530 allocates the frames based on availability of the pooled frontline ECC decoders 535, and the respective configured numbers of pooled first and second sub-decoders as described above. It should be noted that processing of frames having types of ECC codes not including product codes can be allocated to other decoders in the pool 535.

At 730, the pooled sub-decoders 540 and 542 perform a round of decoding on the frames. As set forth above, this can include certain of the sub-decoders 540 and/or 542 operating simultaneously on the frames while other of the sub-decoders 540 and/or 542 are interleaved or multiplexed between frames.

At 740, arbiter 530 determines whether, after a round of decoding by pooled sub-decoders 540 and 542, any frames have been fully decoded, or have exceeded the decoding capabilities of the frontline decoders. If not, processing returns to 730 where another round of decoding of the frames by the other one of decoders 540 and 542 is performed.

At 750, the arbiter 530 determines whether the frames are successfully decoded and corrected. With respect to the frames that are successfully decoded and corrected by the pooled frontline ECC decoders 535 (750: YES), the decoded frames are stored and buffered in DRAM and marked as successfully decoded, at 760. On the other hand, with respect to the frames that cannot be decoded or corrected by the pooled frontline ECC decoders 535 (750: NO), the pooled frontline ECC decoders 535 store and buffer the undecoded frames in DRAM and mark as undecoded, for access by the subsequent ECC decoders 550, at 770. As described, the subsequent ECC decoders 550 can include one or more of the second-line decoders 552, the third-line decoders 554, and the fourth-line decoders 556. The subsequent ECC decoders 550 can decode the previously undecoded and uncorrected frames.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-volatile computer-readable storage medium or non-volatile processor-readable storage medium. Examples of non-volatile memory include but are not limited to, NAND flash memory, NOR flash memory, magnetic MRAM, RRAM, PCM and battery-backed volatile memories. The steps of a method or algorithm disclosed herein may be embodied in a processor-executable software module which may reside on a non-volatile computer-readable or processor-readable storage medium. Non-volatile computer-readable or processor-readable storage media may be any storage media that may be accessed by a computer or a processor. By way of example but not limitation, such non-volatile computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-volatile computer-readable and processor-readable media. Additionally, the operations of a method or algorithm may reside as one or any combination or set of codes and/or instructions on a non-volatile processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for correcting data read from one or more non-volatile memory devices of a memory system, the method comprising:
   receiving two or more frames of the data from the one or more non-volatile memory devices, wherein all of the received frames are coded using an Error Correction Code (ECC) comprising first and second sub-codes;
   decoding each of the two or more frames by passing each of the two or more frames sequentially and alternately between first and second ECC sub-decoders respectively configured to operate on the first and second sub-codes; and
   wherein decoding includes processing, simultaneously, a first frame of the two or more frames by the first sub-decoder and a second frame of the two or more frames by the second sub-decoder.

2. The method of claim 1, further comprising receiving each of the two or more frames from one of a plurality of read channels, communicatively connected to the one or more non-volatile memory devices.

3. The method of claim 1, further comprising selecting the first ECC sub-decoder to process the first frame from a plurality of first ECC sub-decoders and selecting the second ECC sub-decoder to process the second frame from a plurality of second ECC sub-decoders.

4. The method of claim 1, wherein the received frames are coded using an ECC further comprising a third sub-code, and
   wherein decoding further includes passing each of the two or more frames alternately between the first and second ECC sub-decoders and a third sub-decoder configured to operate on the third sub-code, and
   wherein decoding further includes a third frame by the third sub-decoder simultaneously with the first frame by the first sub-decoder and a second frame of the two or more frames by the second sub-decoder.

5. The method of claim 1, wherein the ECC comprises a product code in which the frames are arranged in an array having first and second dimensions corresponding to the first and second sub-codes.

6. A method for correcting data read from a plurality of non-volatile memory devices of a memory system, the method comprising:
   receiving, by an arbiter via a plurality of read channels, frames of the data from the plurality of non-volatile memory devices, wherein all of the frames received are coded with an Error Correction Code (ECC) comprising first and second sub-codes;
   allocating, by the arbiter, the frames among a first plurality of pooled first sub-decoders and a second plurality of pooled second sub-decoders, the first and second sub-decoders respectively configured to operate on the first and second sub-codes; and
   decoding the frames, by the first plurality of pooled first sub-decoders and the second plurality of pooled second sub-decoders, wherein decoding includes alternating the frames between the first plurality of pooled first sub-decoders and the second plurality of pooled second sub-decoders such that decoding of the frames by the first plurality of first sub-decoders and second plurality of second sub-decoders occurs at least partially simultaneously.

7. The method of claim 6, wherein the first plurality of pooled first sub-decoders and the second plurality of second sub-decoders are outside of the plurality of read channels.

8. The method of claim 6, further comprising:
   determining that the first plurality of pooled first sub-decoders and the second plurality of pooled second sub-decoders failed to decode some of the frames; and
   storing the some of the frames into a memory buffer for access by a plurality of subsequent ECC decoders.

9. The method of claim 6, wherein allocating includes configuring respective numbers of the first and second pluralities to be different integer numbers.

10. The method of claim 9, wherein the different integer numbers correspond to respective different decoding times of the first and second pluralities of first and second sub-decoders.

11. The method of claim 6, wherein the first and second sub-codes are different ECC codes.

12. The method of claim 6, wherein the ECC comprises a product code in which the frames are arranged in an array having first and second dimensions corresponding to the first and second sub-codes.

13. A memory system comprising:
   a non-volatile memory; and
   a controller including:
   an arbiter configured to receive two or more frames of data from the non-volatile memory, wherein all of the received frames are coded using an Error Correction Code (ECC) comprising first and second sub-codes; and
   first and second ECC sub-decoders respectively configured to operate on the first and second sub-codes,
   wherein the arbiter is further configured to cause the first and second ECC sub-decoders to alternately decode the two or more frames and to further cause the first and second ECC sub-decoders to process the two or more frames at least partially simultaneously.

14. The memory system of claim 13, wherein the first and second ECC sub-decoders are allocated to a single one of a plurality of read channels corresponding to the non-volatile memory.

15. The memory system of claim 13, wherein the first and second ECC sub-decoders are pooled for use with a plurality of read channels corresponding to a plurality of the non-volatile memory.

16. The memory system of claim 13, further comprising a plurality of subsequent ECC decoders configured to decode data failed to be decoded by the first and second ECC sub-decoders.

17. The memory system of claim 13, wherein the first and second sub-codes are different ECC codes.

18. The memory system of claim 13, wherein the ECC comprises a product code in which the frames are arranged in an array having first and second dimensions corresponding to the first and second sub-codes.

* * * * *